United States Patent
Wei et al.

(10) Patent No.: US 11,127,934 B2
(45) Date of Patent: Sep. 21, 2021

(54) MANUFACTURING METHOD OF DISPLAY PANEL AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventors: Lei Wei, Guangdong (CN); Macai Lu, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 21 days.

(21) Appl. No.: 16/645,033

(22) PCT Filed: Dec. 27, 2019

(86) PCT No.: PCT/CN2019/129174
§ 371 (c)(1),
(2) Date: Mar. 6, 2020

(87) PCT Pub. No.: WO2021/120301
PCT Pub. Date: Jun. 24, 2021

(65) Prior Publication Data
US 2021/0184182 A1  Jun. 17, 2021

(30) Foreign Application Priority Data
Dec. 17, 2019 (CN) .......................... 201911303257.3

(51) Int. Cl.
*H01L 51/56* (2006.01)
*H01L 27/32* (2006.01)

(52) U.S. Cl.
CPC ............ *H01L 51/56* (2013.01); *H01L 27/323* (2013.01); *H01L 2251/308* (2013.01)

(58) Field of Classification Search
None
See application file for complete search history.

(56) References Cited

U.S. PATENT DOCUMENTS

| 2018/0089491 A1* | 3/2018 | Kim | .................... G06K 9/00912 |
| 2018/0158877 A1 | 6/2018 | Zeng et al. | |
| 2020/0285344 A1 | 9/2020 | Liu et al. | |
| 2021/0041987 A1* | 2/2021 | Kim | ........................ A61B 5/024 |

FOREIGN PATENT DOCUMENTS

| CN | 107680988 A | 2/2018 |
| CN | 109933237 A | 6/2019 |
| CN | 110287808 A | 9/2019 |
| CN | 209373565 U | 9/2019 |
| CN | 110534031 A | 12/2019 |

* cited by examiner

*Primary Examiner* — J. E. Schoenholtz

(57) ABSTRACT

Embodiments of the present application provide a method for manufacturing a display panel and a display panel. In the present scheme, a display unit is disposed on a first surface of a base substrate and a sensing unit is disposed on a second surface of the base substrate, which can solve the problems of reducing the aperture ratio of the display panel or lowing the resolution of the display panel caused by integrating the sensing unit and the display unit on the display panel at the same time.

17 Claims, 2 Drawing Sheets

MANUFACTURING METHOD OF DISPLAY PANEL AND DISPLAY PANEL

FIELD OF INVENTION

The present application relates to the field of display technologies, and in particular, to a method for manufacturing a display panel and a display panel.

BACKGROUND OF INVENTION

With the development of display technologies, users' bioinformation authentication schemes have been widely used in various display devices. For example, fingerprint authentication scheme and face authentication scheme.

In a bioinformation authentication scheme, it is usually necessary to integrate a sensing unit on a display panel through a manufacturing process of the display panel. However, since the sensing unit formed by the display panel manufacturing process is close to a size of the display unit, integrating the sensing unit and the display unit on the display panel at the same time may cause a decrease in an aperture ratio of the display panel or a decrease in the resolution of the display panel.

Technical Problem

Present bioinformation authentication scheme, integrating the sensing unit and the display unit on the display panel at the same time may cause a decrease in the aperture ratio of the display panel or a decrease in the resolution of the display panel.

SUMMARY OF INVENTION

Technical Solutions

The embodiments of the present application provide a method for manufacturing a display panel and a display panel, which can solve the problem of reducing an aperture ratio of a display panel caused by integrating the sensing unit and the display unit on the display panel at the same time.

In a first aspect, an embodiment of the present application provides a method for manufacturing a display panel, including:

providing a base substrate, wherein the base substrate includes a first surface and a second surface;

forming a display unit on the first surface of the base substrate;

forming a protective film on a side of the display unit away from the base substrate;

performing a first inversion on the base substrate provided with the display unit, and forming a sensing unit on the second surface of the base substrate; and performing a second inversion on the base substrate provided with the display unit and the sensing unit, and removing the protective film on the display unit.

In the method for manufacturing the display panel provided in the embodiment of the present application, the step of forming a sensing unit on the second surface of the base substrate, includes:

depositing an electrode layer, a dielectric layer, an active layer, a source-drain layer, a passivation layer, and a protective layer on the second surface of the base substrate in sequence to form the sensing unit.

In the method for manufacturing the display panel provided in the embodiment of the present application, the step of depositing an electrode layer, a dielectric layer, an active layer, a source-drain layer, a passivation layer, and a protective layer on the second surface of the base substrate in sequence to form the sensing unit, includes:

depositing a first electrode, a second electrode, and a third electrode disposed at intervals on the second surface of the base substrate to form the electrode layer;

depositing the dielectric layer on the electrode layer;

depositing a first semiconductor, a second semiconductor, and a third semiconductor disposed at intervals on the dielectric layer to form the active layer; and forming the source-drain layer, the passivation layer, and the protection layer in sequence on the active layer to form the sensing unit.

In the method for manufacturing the display panel provided in the embodiment of the present application, the first semiconductor corresponds to the first electrode, the second semiconductor corresponds to the second electrode, and the third semiconductor corresponds to the third electrode.

In the method for manufacturing the display panel provided in the embodiment of the present application, the step of removing the protective film on the display unit, includes:

etching the protective film on the display unit by a dry etching process to remove the protective film.

In the method for manufacturing the display panel provided in the embodiment of the present application, the step of forming a protective film on a side of the display unit away from the base substrate, includes:

forming the protective film on the side of the display unit away from the base substrate by a spin coating process, a chemical vapor deposition process, or a sputtering deposition process.

In the method for manufacturing the display panel provided in the embodiment of the present application, a material of the protective film includes oxide or nitride.

In the method for manufacturing the display panel provided in the embodiment of the present application, the first electrode and the second electrode are metal electrodes, and the third electrode is a transparent electrode.

In the method for manufacturing the display panel provided in the embodiment of the present application, a material of the first electrode and the second electrode includes molybdenum, chromium, tungsten, titanium, aluminum, or copper, or an alloy of at least one of molybdenum, chromium, tungsten, titanium, aluminum, and copper, and a material of the third electrode includes azo compound, indium tin oxide, or zinc oxide.

In the method for manufacturing the display panel provided in the embodiment of the present application, the sensing unit includes a touch fingerprint recognition sensing unit, an optical fingerprint recognition sensing unit, or an ambient light sensing unit.

In a second aspect, an embodiment of the present application provides a display panel, including:

a base substrate including a first surface and a second surface;

a display unit disposed on the first surface of the base substrate; and a sensing unit disposed on the second surface of the base substrate.

In the display panel provided in the embodiment of the present application, the sensing unit includes an electrode layer, a dielectric layer, an active layer, a source-drain layer, a passivation layer, and a protective layer sequentially stacked on the second surface of the base substrate.

In the display panel provided in the embodiment of the present application, the electrode layer includes a first electrode, a second electrode, and a third electrode disposed at intervals, wherein the third electrode is disposed between the first electrode and the second electrode.

In the display panel provided in the embodiment of the present application, the first electrode and the second electrode are metal electrodes, and the third electrode is a transparent electrode.

In the display panel provided in the embodiment of the present application, the active layer includes a first semiconductor, a second semiconductor, and a third semiconductor disposed at intervals, and the first semiconductor corresponds to the first electrode, the second semiconductor corresponds to the second electrode, and the third semiconductor corresponds to the third electrode.

In the display panel provided in the embodiment of the present application, a material of the first electrode and the second electrode includes molybdenum, chromium, tungsten, titanium, aluminum, or copper, or an alloy of at least one of molybdenum, chromium, tungsten, titanium, aluminum, and copper, and a material of the third electrode includes azo compound, indium tin oxide, or zinc oxide.

In the display panel provided in the embodiment of the present application, the sensing unit includes a touch fingerprint recognition sensing unit, an optical fingerprint recognition sensing unit, or an ambient light sensing unit.

In the display panel provided in the embodiment of the present application, a material of the protective layer includes polyethylene terephthalate or polymethyl methacrylate.

In the display panel provided in the embodiment of the present application, a material of the active layer includes an organic light-emitting semiconductor material having a mobility greater than $0.5 \text{ cm}^2/\text{V}\cdot\text{S}$.

In the display panel provided in the embodiment of the present application, a material of the dielectric layer includes aluminum oxide, silicon oxide, or silicon nitride.

Beneficial Effect

The method for manufacturing a display panel provided in the embodiments of the present application includes providing a base substrate, the base substrate including a first surface and a second surface; forming a display unit on the first surface of the base substrate; forming a protective film on a side of the display unit away from the base substrate; performing a first inversion on the base substrate provided with the display unit, and forming a sensing unit on the second surface of the base substrate; and performing a second inversion on the base substrate provided with the display unit and the sensing unit, and removing the protective film on the display unit. In the present scheme, the display unit is disposed on the first surface of the base substrate and the sensing unit is disposed on the second surface of the base substrate, which can solve the problems of reducing the aperture ratio of the display panel or lowing the resolution of the display panel caused by integrating the sensing unit and the display unit on the display panel at the same time.

DETAILED DESCRIPTION OF EMBODIMENTS

The following content combines with the drawings and the embodiment for describing the present invention in detail. It is obvious that the following embodiments are only some embodiments of the present invention. For the skilled persons of ordinary skill in the art without creative effort, the other embodiments obtained thereby are still covered by the present invention.

The embodiments of the present application provide a method for manufacturing a display panel and a display panel, which will be described in detail below respectively.

Figure 1:
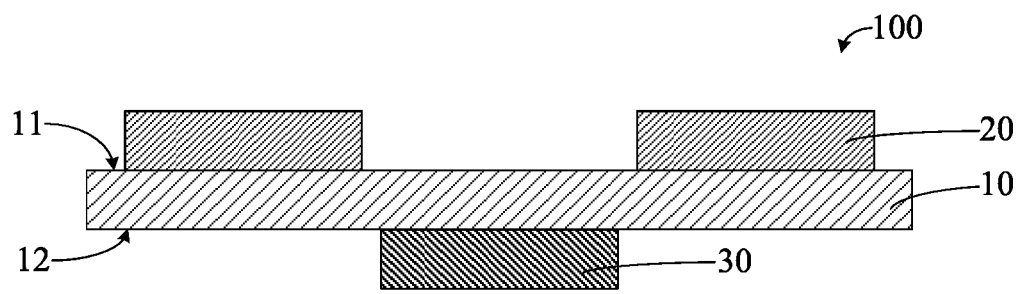
FIG. 1 is a schematic structural diagram of a display panel provided by an embodiment of the present application.

Please refer to FIG. 1, which is a schematic structural diagram of a display panel provided by an embodiment of the present application. The display panel 100 can include a base substrate 10, a display unit 20, and a sensing unit 30.

The base substrate 10 can include a first surface 11 and a second surface 12. The material of the base substrate 10 can include glass, quartz, sapphire, or indium tin oxide. It should be noted that the material of the base substrate 10 includes, but is not limited to, the above materials, and can also include other materials.

The display unit 20 can be disposed on the first surface 11 of the base substrate 10. It can be understood that the display unit 20 can be a display module, such as a thin film transistor (TFT) display module.

The sensing unit 30 can be disposed on the second surface 12 of the base substrate 10. It can be understood that the sensing unit 30 can be a touch fingerprint recognition sensing unit, an optical fingerprint recognition sensing unit, or an ambient light sensing unit.

It should be noted that, in the description of this application, the terms "first", "second", and "third" are used for descriptive purposes only, and cannot be understood as indicating or implying relative importance or implicitly indicating the number of technical features indicated. Thus, the features defined as "first," "second," and "third" may explicitly or implicitly include one or more of the features.

In the description of the present invention, it is to be understood that the terms such as "center", "longitudinal", "transverse", "length", "width", "thickness", "upper", "lower", "front", "rear", "left", "right", "vertical", "horizontal", "top", "bottom", "inside", "outside", "clockwise", "counterclockwise", etc., the orientation or positional relationship of the indications is based on the orientation or positional relationship shown in the drawings, and is merely for the convenience of the description of the invention and the simplified description, rather than indicating or implying that the device or component referred to has a specific orientation, in a specific orientation. The construction and operation are therefore not to be construed as limiting the invention.

Figure 2:
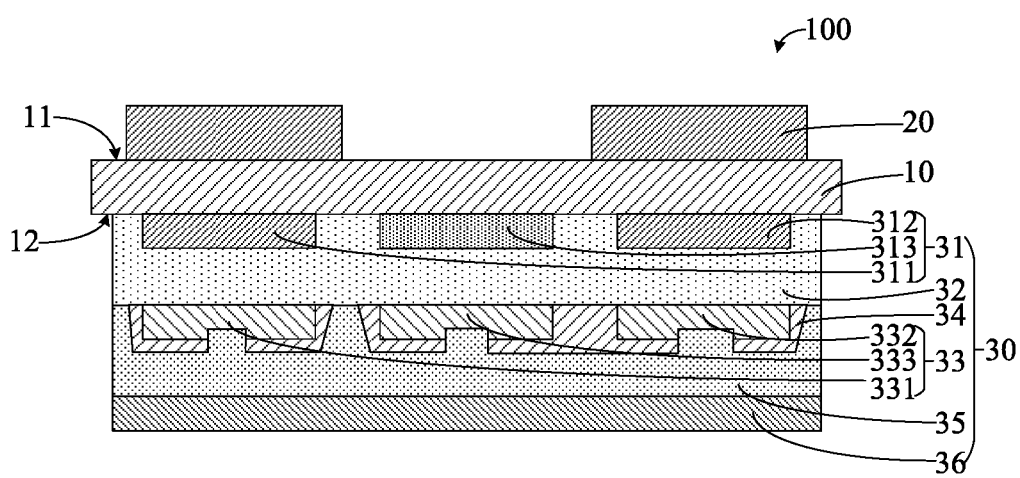
FIG. 2 is another schematic structural diagram of a display panel provided by an embodiment of the present application.

Referring to FIG. 2, in some embodiments, the sensing unit 30 can include an electrode layer 31, a dielectric layer 32, an active layer 33, a source-drain layer 34, a passivation layer 35, and a protective layer 36 that are sequentially stacked on the second surface 12 of the base substrate 10.

The electrode layer 31 can include a first electrode 311, a second electrode 312, and a third electrode 313 disposed at intervals. It should be noted that the third electrode 313 can be disposed between the first electrode 311 and the second electrode 312.

In some embodiments, the first electrode 311 and the second electrode 312 can be metal electrodes. The material of the metal electrodes can include molybdenum (Mo), chromium (Cr), tungsten (W), titanium (Ti), aluminum (Al), or copper (Cu), or an alloy of at least one of molybdenum (Mo), chromium (Cr), tungsten (W), titanium (Ti), aluminum (Al), and copper (Cu). The third electrode 313 is a sensor transparent electrode, and the material of the sensor transparent electrode can include azo compound (AZO), indium tin oxide (ITO), or zinc oxide (ZnO).

The material of the dielectric layer 32 can include aluminum oxide (AlOx), silicon oxide (SiOx), or silicon nitride (SiNx).

The active layer 33 can include a first semiconductor 331, a second semiconductor 332, and a third semiconductor 333 disposed at intervals. It should be noted that the first semiconductor 331 corresponds to the first electrode 311 of the electrode layer 31, the second semiconductor 332 corresponds to the second electrode 312 of the electrode layer 31, and the third semiconductor 333 corresponds to the third electrode of the electrode layer 31. The material of the active layer 33 can include indium gallium zinc oxide (IGZO), zinc oxide (ZnO), amorphous silicon (A-Si), or organic optoelectronic semiconductors having a mobility greater than 0.5 $cm^2/V \cdot S$.

The material of the source-drain layer 34 can include molybdenum (Mo), chromium (Cr), tungsten (W), titanium (Ti), aluminum (Al), or copper (Cu), or an alloy of at least one of molybdenum (Mo), chromium (Cr), Tungsten (W), titanium (Ti), aluminum (Al), and copper (Cu).

The material of the passivation layer 35 can include aluminum oxide (AlOx), silicon oxide (SiOx), or silicon nitride (SiNx).

The material of the protective layer 36 can include a film material with good mechanical properties such as polyethylene terephthalate (PET) or polymethyl methacrylate (PMMA). The protective layer 36 can prevent problems such as scratching and abrasion of the sensor unit 30 in the subsequent processes.

From the above, the display panel 100 provided in the embodiment of the present application includes the base substrate 10, the display unit 20, and the sensing unit 30. The base substrate 10 includes the first surface 11 and the second surface 12. The display unit 20 is disposed on the first surface 11 of the base substrate 10. The sensing unit 30 is disposed on the second surface 12 of the base substrate 10. In the present scheme, the display unit 20 is disposed on the first surface 11 of the base substrate 10 and the sensing unit 30 is disposed on the second surface 12 of the base substrate 10, which can solve the problems of reducing an aperture ratio of the display panel or lowing the resolution of the display panel caused by integrating the sensing unit and the display unit on the display panel at the same time.

Figure 3:
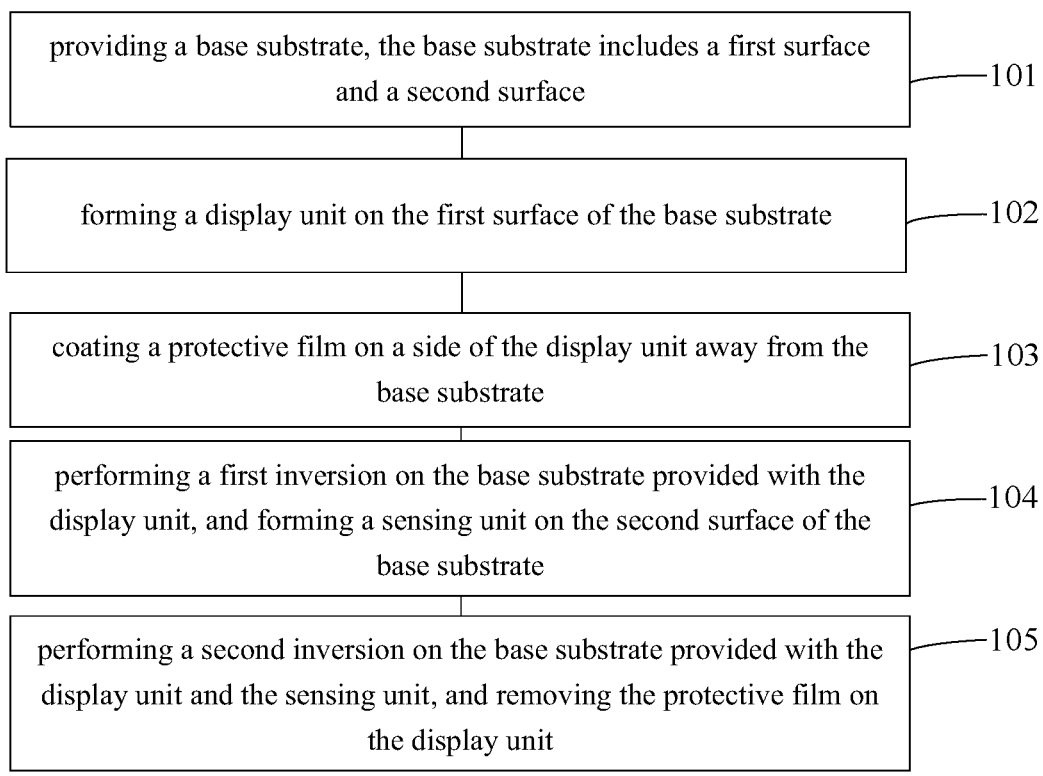
FIG. 3 is a schematic flowchart of a method for manufacturing a display panel according to an embodiment of the present application.

Referring to FIG. 3, an embodiment of the present application further provides a method for manufacturing a display panel. The specific process of the manufacturing method of the display panel 100 can be as follows.

101, providing a base substrate 10, wherein the base substrate 10 includes a first surface 11 and a second surface 12.

The material of the base substrate 10 can include glass, quartz, sapphire, or indium tin oxide. It should be noted that the material of the base substrate 10 includes, but is not limited to, the above materials, and can also include other materials.

102, forming a display unit 20 on the first surface 11 of the base substrate 10.

The display unit 20 can be a display module, such as a TFT display module.

103, forming a protective film on a side of the display unit 20 away from the base substrate 10.

The protective film can be formed by a spin coating process, a chemical vapor deposition process, or a sputtering deposition process. The material of the protective film can include oxide, nitride, or polymer material with good mechanical and heat resistance properties.

The protective film can protect the display unit 20 to prevent the display unit 20 from scratching, abrading, and the like in the subsequent processes of the display panel 100.

104, performing a first inversion on the base substrate 10 provided with the display unit to form a sensing unit 30 on the second surface 12 of the base substrate 10.

Specifically, the base substrate 10 provided with the display unit 20 can be inverted for a first time so that the second surface 12 of the base substrate 10 faces upward, and then depositing an electrode layer 31, a dielectric layer 32, an active layer 33, a source-drain layer 34, a passivation layer 35, and a protection layer 36 on the second surface 12 of the base substrate 10 in sequence to form the sensing unit 30.

The step of depositing an electrode layer 31, a dielectric layer 32, an active layer 33, a source-drain layer 34, a passivation layer 35, and a protection layer 36 on the second surface 12 of the base substrate 10 in sequence to form the sensing unit 30, can includes:

depositing a first electrode 311, a second electrode 312, and a third electrode 313 at intervals on the second surface 12 of the base substrate 10 to form the electrode layer 31;

depositing the dielectric layer 32 on the electrode layer 31;

depositing a first semiconductor 331, a second semiconductor 332, and a third semiconductor 333 at intervals on the dielectric layer 32 to form the active layer 33; and forming the source-drain layer 34, the passivation layer 35, and the protection layer 36 in sequence on the active layer 33 to form the sensing unit 30.

It should be noted that the first semiconductor 331 corresponds to the first electrode 311 of the electrode layer 31, the second semiconductor 332 corresponds to the second electrode 312 of the electrode layer 31, and the third semiconductor 333 corresponds to the third electrode of the electrode layer 31.

105, performing a second inversion on the base substrate 10 provided with the display unit 20 and the sensing unit 30 to remove the protective film on the display unit 20.

Specifically, after the sensing unit 30 is formed, the substrate 10 on which the display unit 20 and the sensing unit 30 are disposed can be inverted for a second time so that the first surface 11 of the substrate 10 faces upward. Then, the protective film on a side of the display unit 20 away from the substrate 10 is etched by a dry etching process to remove the protective film. Therefore, the protective film is prevented from affecting the display effect of the display panel 100.

From the above, the method for manufacturing a display panel provided in the embodiment of the present application includes providing the base substrate 10 including the first surface 11 and the second surface 12; forming the display unit 20 on the first surface 11 of the base substrate 10; forming the protective film on the side of the display unit 20 away from the base substrate 10; performing a first inversion on the base substrate 10 provided with the display unit 20, and forming the sensing unit 30 on the second surface 12 of the base substrate 10; and performing a second inversion on the base substrate 10 provided with the display unit 20 and the sensing unit 30, and removing the protective film on the display unit 20. In the present scheme, the display unit 20 is disposed on the first surface 11 of the base substrate 10 and the sensing unit 30 is disposed on the second surface 12 of the base substrate 10, which can solve the problems of reducing the aperture ratio of the display panel 100 or lowing the resolution of the display panel 100 caused by integrating the sensing unit and the display unit on the display panel at the same time.

In the above embodiments, the description of each embodiment has its own emphasis. For a part that is not described in detail in one embodiment, reference can be made to related descriptions in other embodiments.

A method for manufacturing a display panel and a display panel provided in the embodiments of the present application have been described in detail above. Specific examples have been used in this document to explain the principles and implementation of the present application. Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A method for manufacturing a display panel, comprising:
    providing a base substrate, wherein the base substrate comprises a first surface and a second surface;
    forming a display unit on the first surface of the base substrate;
    forming a protective film on a side of the display unit away from the base substrate;
    performing a first inversion on the base substrate provided with the display unit, and forming a sensing unit on the second surface of the base substrate; and
    performing a second inversion on the base substrate provided with the display unit and the sensing unit, and removing the protective film on the display unit.

2. The method for manufacturing the display panel of claim 1, wherein the step of forming a sensing unit on the second surface of the base substrate, comprises:
    depositing an electrode layer, a dielectric layer, an active layer, a source-drain layer, a passivation layer, and a protective layer on the second surface of the base substrate in sequence to form the sensing unit.

3. The method for manufacturing the display panel of claim 2, wherein the step of depositing an electrode layer, a dielectric layer, an active layer, a source-drain layer, a passivation layer, and a protective layer on the second surface of the base substrate in sequence to form the sensing unit, comprises:
    depositing a first electrode, a second electrode, and a third electrode disposed at intervals on the second surface of the base substrate to form the electrode layer;
    depositing the dielectric layer on the electrode layer;
    depositing a first semiconductor, a second semiconductor, and a third semiconductor disposed at intervals on the dielectric layer to form the active layer; and
    forming the source-drain layer, the passivation layer, and the protection layer in sequence on the active layer to form the sensing unit.

4. The method for manufacturing the display panel of claim 3, wherein the first semiconductor corresponds to the first electrode, the second semiconductor corresponds to the second electrode, and the third semiconductor corresponds to the third electrode.

5. The method for manufacturing the display panel of claim 1, wherein the step of removing the protective film on the display unit, comprises:
    etching the protective film on the display unit by a dry etching process to remove the protective film.

6. The method for manufacturing the display panel of claim 1, wherein the step of forming a protective film on a side of the display unit away from the base substrate, comprises:
    forming the protective film on the side of the display unit away from the base substrate by a spin coating process, a chemical vapor deposition process, or a sputtering deposition process.

7. The method for manufacturing the display panel claim 1, wherein a material of the protective film comprises oxide or nitride.

8. The method for manufacturing the display panel claim 3, wherein the first electrode and the second electrode are metal electrodes, and the third electrode is a transparent electrode.

9. The method for manufacturing the display panel of claim 8, wherein a material of the first electrode and the second electrode comprises molybdenum, chromium, tungsten, titanium, aluminum, or copper, or an alloy of at least one of molybdenum, chromium, tungsten, titanium, aluminum, and copper, and a material of the third electrode comprises azo compound, indium tin oxide, or zinc oxide.

10. The method for manufacturing the display panel of claim 1, wherein the sensing unit comprises a touch fingerprint recognition sensing unit, an optical fingerprint recognition sensing unit, or an ambient light sensing unit.

11. A display panel, comprising:
    a base substrate comprising a first surface and a second surface;
    a display unit disposed on the first surface of the base substrate; and
    a sensing unit disposed on the second surface of the base substrate;
    wherein the sensing unit comprises an electrode layer, a dielectric layer, an active layer, a source-drain layer, a passivation layer, and a protective layer sequentially stacked on the second surface of the base substrate.

12. The display panel of claim 11, wherein the electrode layer comprises a first electrode, a second electrode, and a third electrode disposed at intervals, wherein the third electrode is disposed between the first electrode and the second electrode.

13. The display panel of claim 12, wherein the first electrode and the second electrode are metal electrodes, and the third electrode is a transparent electrode.

14. The display panel of claim 12, wherein the active layer comprises a first semiconductor, a second semiconductor, and a third semiconductor disposed at intervals, and the first semiconductor corresponds to the first electrode, the second semiconductor corresponds to the second electrode, and the third semiconductor corresponds to the third electrode.

15. The display panel of claim 13, wherein a material of the first electrode and the second electrode comprises molybdenum, chromium, tungsten, titanium, aluminum, or copper, or an alloy of at least one of molybdenum, chromium, tungsten, titanium, aluminum, and copper, and a material of the third electrode comprises azo compound, indium tin oxide, or zinc oxide.

16. The display panel of claim 11, wherein a material of the protective layer comprises polyethylene terephthalate or polymethyl methacrylate.

17. The display panel of claim 11, wherein a material of the dielectric layer comprises aluminum oxide, silicon oxide, or silicon nitride.

\* \* \* \* \*